United States Patent [19]

Masuko et al.

[11] Patent Number: 5,033,052
[45] Date of Patent: Jul. 16, 1991

[54] OPTICAL SEMICONDUCTOR DEVICE AND PRODUCTION METHOD THEREOF

[75] Inventors: Takayuki Masuko, Tokyo; Kaoru Moriya, Kawasaki; Hiroki Okushima, Yokohama, all of Japan

[73] Assignee: Fujitsu Limited, Kawasaki, Japan

[21] Appl. No.: 445,680
[22] PCT Filed: Mar. 22, 1989
[86] PCT No.: PCT/JP89/00298
 § 371 Date: Nov. 15, 1989
 § 102(e) Date: Nov. 15, 1989
[87] PCT Pub. No.: WO89/09421
 PCT Pub. Date: Oct. 5, 1989

[30] Foreign Application Priority Data

Mar. 22, 1988 [JP] Japan .................................. 63-67857
Mar. 25, 1988 [JP] Japan .................................. 63-72642
Jul. 4, 1988 [JP] Japan .................................. 63-166356
Aug. 9, 1988 [JP] Japan .................................. 63-197225
Aug. 24, 1988 [JP] Japan .................................. 63-208132

[51] Int. Cl.$^5$ .............................................. H01S 3/43
[52] U.S. Cl. ...................................... 372/36; 372/101; 357/74; 357/81

[58] Field of Search .................. 372/36, 101; 357/74, 357/81; 350/96.18, 96.15, 96.20; 250/227.11

[56] References Cited
U.S. PATENT DOCUMENTS
4,793,688 12/1988 Aiki et al. ............................ 350/252
4,834,492 5/1989 Ishii et al. ........................ 350/96.20

Primary Examiner—Frank Gonzalez
Assistant Examiner—Galen J. Hansen
Attorney, Agent, or Firm—Staas & Halsey

[57] ABSTRACT

In an optical semiconductor device which comprises a mount (52a) for holding an optical semiconductor element (40) and a lens holder (54a) which holds a lens (50) for converting a beam shape of a light emitted from the optical semiconductor element (40) and is fixed to the mount (52a) and a production method thereof wherein at least one of locations for shrinkage by laser irradiation (58a) are provided at least on one of the mount (52a) and the lens holder (54a), and the relative positions of the optical semiconductor element (40) and the lens (50) are adjustable in any desired direction by a laser irradiation on the location for shrinkage by laser irradiation (58a).

18 Claims, 11 Drawing Sheets

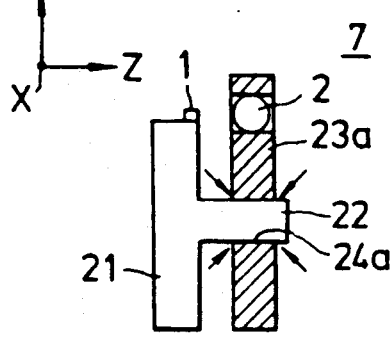
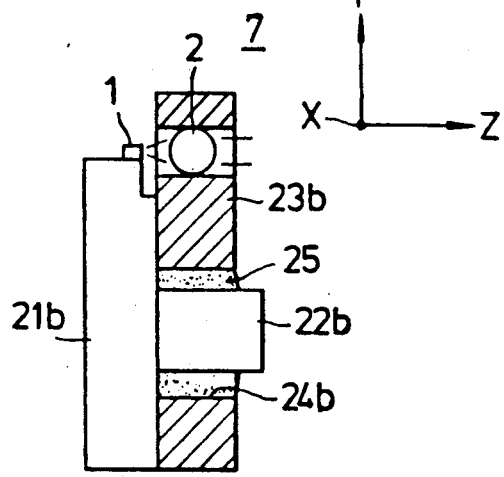
PRIOR ART FIG. 5
PRIOR ART FIG. 6
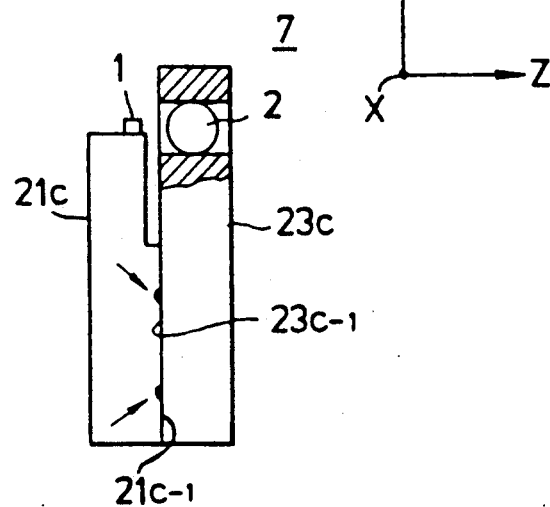
PRIOR ART FIG. 7
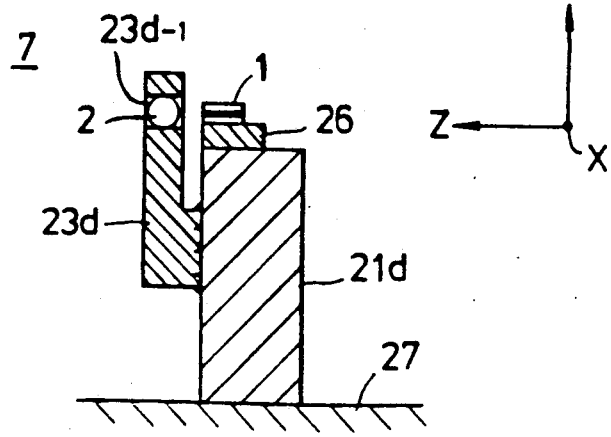
PRIOR ART FIG. 8

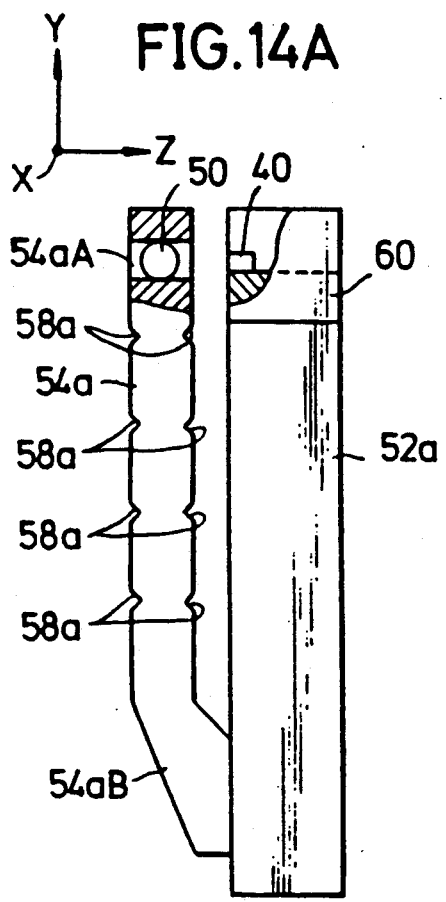
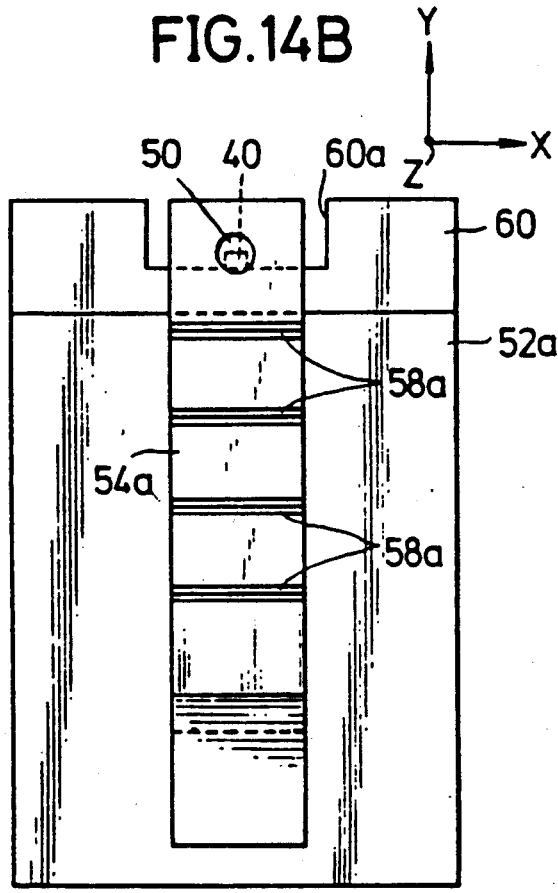
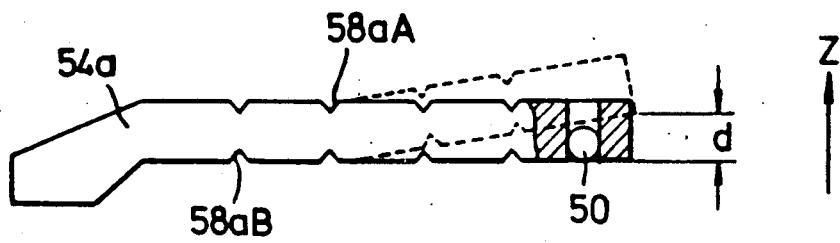

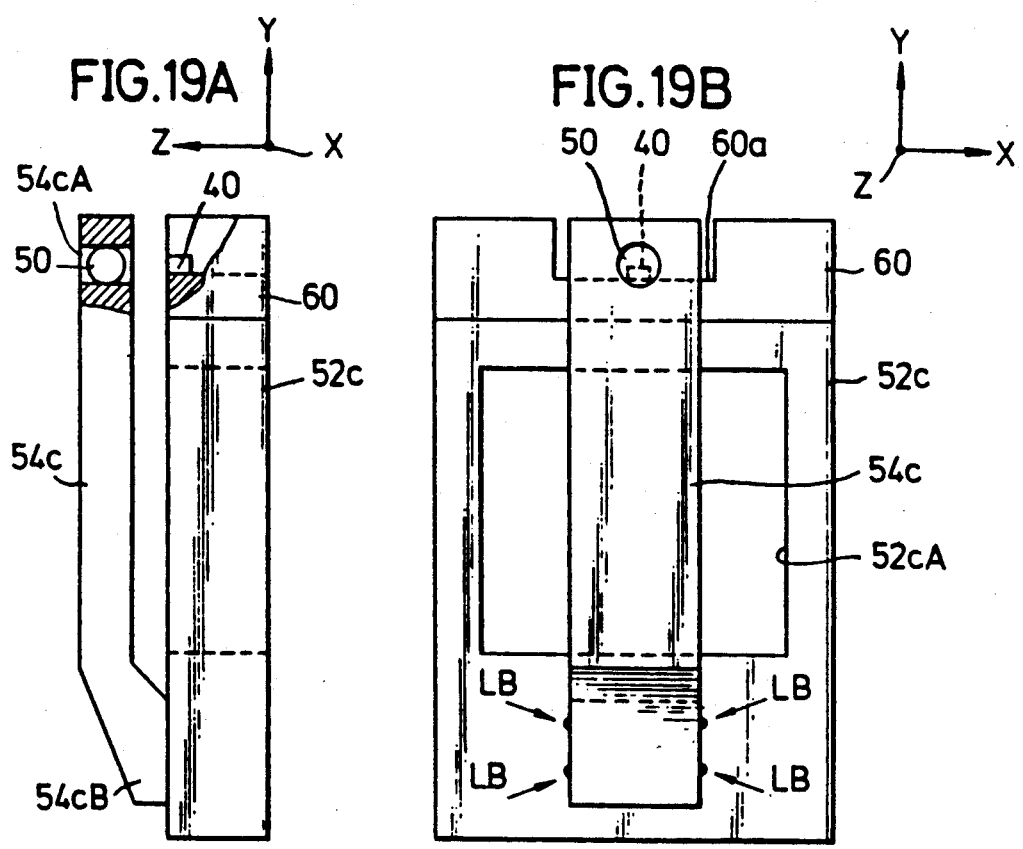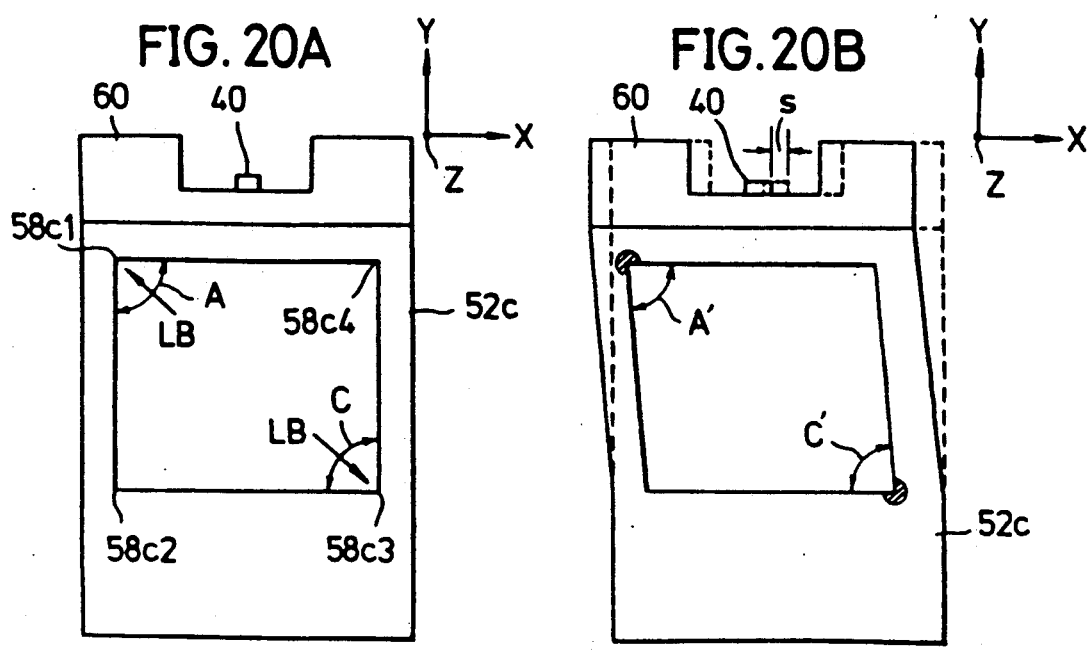

OPTICAL SEMICONDUCTOR DEVICE AND PRODUCTION METHOD THEREOF

FIELD OF THE INVENTION

The present invention generally relates to optical semiconductor devices and production methods thereof, and more particularly to a semiconductor device which is used in the field of optical communication or optical transmission and a production method thereof.

DESCRIPTION OF THE RELATED ART

For example, in an optical communication system which uses an optical fiber as an optical transmission path, an optical semiconductor element and a light receiving end surface of an optical fiber are fixed with a predetermined positional relationship and a condenser lens is provided between the optical semiconductor element and the light receiving end surface so that a light emitted from the semiconductor element is directed within the optical fiber. The semiconductor element is a semiconductor laser, a light emitting diode or the like. The lens is provided to make a beam conversion so as to obtain a high coupling efficiency between the optical semiconductor element and the optical fiber, because the beam parameters of the optical semiconductor element and the optical fiber greatly differ and the optical coupling loss would otherwise become large if the two were simply arranged close to each other. Normally, the optical semiconductor element, the lens and the optical fiber are used in the form of an optical semiconductor module which is assembled integrally. In such an optical semiconductor module, the positional relationships of the constituent parts directly affect the optical coupling efficiency, and it is required that each constituent part is positioned with an extremely high accuracy of 1 μm or less. In addition, it is also required that this high positioning accuracy is maintained for a long period of time.

FIG. 1 schematically shows an example of a conventional optical semiconductor module. Light emitted from an optical semiconductor element 1 is formed into generally parallel light beams by a lens 2, transmitted in a forward direction through an optical isolator 3, and is directed to an optical fiber 6 by being converged by Green rod lenses 4 and 5. When producing this kind of optical semiconductor module, the optical semiconductor element 1 and the lens 2 are fixed with a predetermined positional relationship to constitute an optical semiconductor assembly 7 which is indicated by a phantom line while the Green rod lens 5 and the optical fiber 6 are fixed with a predetermined positional relationship to constitute a fiber assembly 8 which is indicated by a phantom line. The assemblies 7 and 8, the optical isolator 3 and the Green rod lens 4 are assembled integrally. The constituent parts of the optical semiconductor module are made in the form of assemblies because it is simple to adjust the optical axis by adjusting the positional relationships of the assemblies.

FIG. 2 schematically shows another example of a conventional optical semiconductor module. In FIG. 2, those parts which are essentially the same as those corresponding parts in FIG. 1 are designated by the same reference numerals, and a description thereof will be omitted. In FIG. 2, the light which is emitted from the optical semiconductor element 1 with a predetermined angular aperture is formed into the generally parallel light beams by the lens 2 and converged by a lens 9 to enter the end surface of the optical fiber 6. The lens 9 and the optical fiber 6 are fixed with a predetermined positional relationship and constitute a fiber assembly 8a which is indicated by a phantom line. OA denotes the optical axis.

FIG. 3 is a perspective view of the conventional optical semiconductor assembly 7. In FIG. 3, the optical semiconductor element (semiconductor laser chip) 1 is mounted on a chip carrier 12 which is made of copper, for example. The chip carrier 12 is soldered on a block 14 which is made of stainless steel (SUS), and the block 14 is fixed on a SUS base 16 by a laser welding after the position of the block 14 is adjusted in a Z-axis direction which corresponds to the direction of the height of the block 14. A lens holder 18 is made of SUS, for example. A fitting hole 18a is formed in the lens holder 18, and the lens 2 is press-fit and fixed within the fitting hole 18a. After the relative position of the lens 2 with respect to the optical semiconductor element 1 is adjusted in X-axis and Y-axis directions, the lens holder 18 is fixed on the base by a laser welding by a YAG laser.

However, in the optical semiconductor assembly 7 shown in FIG. 3, the laser welding is used to fix the block 14 and the base 16 and to fix the lens holder 18 and the base 16. For this reason, there is a problem in that the distance between the optical semiconductor element 1 and the lens 2 deviates from a design value due to a thermal shrinkage at the welded portions.

FIGS. 4 and 5 are diagrams for explaining concrete examples of the method of adjusting the relative positions of the optical semiconductor element 1 and the lens 2 and the method of fixing the two in another example of the optical semiconductor assembly 7.

According to the method shown in FIG. 4, a support 22 projects from a mount 21 on which the optical semiconductor element 1 is fixed, and the relative positional relationship of the optical semiconductor element 1 and the lens 2 is adjusted in a state where the support 22 is loosely fitted within an inserting hole 24 of a lens holder 23 on which the lens 2 is fixed. In other words, the distance between the optical semiconductor element 1 and the lens is adjusted so that the beam shape of a collimator light falls within a tolerable range, and the inserting hole 24 is filled with a hardening fluid such as an adhesive agent or melting solder at an optimum position.

On the other hand, according to the method shown in FIG. 5, the support 22 of the mount 21 closely fits into an inserting hole 24a of a lens holder 23a. In this state, the relative position adjustment described above is made, and the lens holder 23a and the support 22 are welded by laser by irradiating a laser beam in directions of arrows in FIG. 5.

However, according to the structure and method shown in FIG. 4, the outer diameter of the support 22 and the inner diameter of the inserting hole 24 must be different to a certain extent because of the need to fill the hardening fluid into the inserting hole 24. For this reason, when fixing by use of the adhesive agent, for example, the adjustment may go wrong before the adhesive agent hardens. In addition, when fixing by use of the soldering, for example, there is a problem in that the optical coupling efficiency in the initial state where the fixing took place cannot be maintained for a long period of time due to a creeping phenomenon which occurs after the solder hardens. Further, according to the structure and method shown in FIG. 5, the problems introduced in FIG. 4 do not occur, but there is a problem in that the relative positions of the optical semiconductor element 1 and the lens 2 which are set to the optimum positions deviate due to the thermal shrinkage of the laser welded portions.

FIGS. 6 and 7 are diagrams for explaining concrete examples of the method of adjusting the relative positions of the optical semiconductor element 1 and the lens 2 and the method of fixing the two in still another example of the optical semiconductor assembly 7.

In FIG. 6, a support 22b which has a cylindrical shape, for example, projects from a mount 21b on which the optical semiconductor element 1 is fixed. This support 22b is loosely fitted into an inserting hole 24b of a lens holder 23b on which the lens 2 is fixed. In this state, the relative positional relationship of the optical semiconductor element 1 and the lens 2 is adjusted, and the inserting hole 24b is filled by a solder 25 at the optimum position.

On the other hand, in FIG. 7, a mount 21c and a lens holder 23c on which the optical semiconductor element 1 and the lens 2 are respectively fixed so as to satisfy a predetermined focus condition are subject to an alignment adjustment on an XY plane by sliding flat surfaces 21c-1 and 23c-1 with respect to each other. The mount 21c and the lens holder 23c are fixed by making a laser welding in directions of arrows at end portions of the flat surfaces 21c-1 and 23c-1.

But according to the structure and method shown in FIG. 6, the outer diameter of the support 22b and the inner diameter of the inserting hole 24b must differ to a certain extent because of the need to make the alignment adjustment, and for this reason, the thickness of the soldered portion becomes large. Accordingly, there is a problem in that the optical coupling efficiency in the initial state where the fixing took place cannot be maintained for a long period of time due to the creeping phenomenon which occurs after the solder hardens. In addition, according to the structure and method shown in FIG. 7, the problems introduced in FIG. 6 do not occur, but there is a problem in that the relative positions of the optical semiconductor element 1 and the lens 2 which are set to the optimum positions deviate due to the thermal shrinkage of the laser welded portions.

FIG. 8 is a diagram for explaining another concrete example of the method of adjusting the relative positions of the optical semiconductor element 1 and the lens 2 and the method of fixing the two in another example of the optical semiconductor assembly 7. In FIG. 8, the optical semiconductor element 1 is mounted on a mounting substrate 26. The mounting substrate 26 is a heat sink in the case where the optical semiconductor element 1 is a semiconductor laser, for example, and is a circuit board in the case where the optical semiconductor element 1 is a light receiving element, for example. A rectangular prism shaped mount 21d is made of a stainless steel or the like, for example. The mount 21d is fixed vertically to a surface of a metal substrate 27 which is made of a stainless steel or the like by a laser welding or the like. The mounting substrate 26 is fixed to an upper portion of the mount 21d by a soldering or the like. A lens holder 23d is made of invar or the like, and the lens 2 is press fit within a penetrating hole 23d-1 which is formed in a vicinity of an upper edge of the lens holder 23d.

The lens holder 23d is fixed to a side surface of the mount 21d by a laser welding in a state where the optical axis of the optical semiconductor element 1 coincides with the optical axis of the lens 2. The fixing of the lens holder 23d to the mount 21d is made for example in the following manner. First, the lens holder 23d is held by a robot arm or the like, and a fixing surface of the lens holder 23d is made to contact the side surface of the mount 21d. In the case where the optical semiconductor element 1 is a semiconductor laser, an adjustment is made by finely moving the lens 2 which is a collimator lens up, down, right and left while measuring the optical power of the semiconductor laser which is transmitted through the lens 2 on an optical power meter, a television camera or the like. The fixing surface of the lens holder 23d is fixed to the side surface of the mount 21d by a laser welding at a position where the optical power, that is, the optical coupling efficiency, is a maximum. On the other hand, in the case where the optical semiconductor element 1 is the light receiving element, an adjustment is made by finely moving the lens 2 which is a convergent lens up, down, right and left while measuring the photocurrent of the light which is converged by the lens 2 and irradiated on a light receiving surface of the light receiving element. The fixing surface of the lens holder 23d is fixed to the side surface of the mount 21d by a laser welding at a position where the photocurrent, that is, the optical efficiency, is a maximum. But in FIG. 8, the lens holder 23d and the mount 21d are fixed by laser welding the contact surfaces of the lens holder 23d and the mount 21d over a large range after the adjustment of the optical axis is made. In addition, the laser welding positions are relatively distant from the lens 2, and the lens 2 is provided on a tip end of a so-called cantilever. Hence, when making the laser welding, the portion of the lens holder 23d which is welded before undergoes a thermal shrinkage greater than those at other portions and is drawn towards the mount 21d. As a result, there is a problem in that the lens 2 deviates from the predetermined set position due to the thermal distortion, thereby deteriorating the optical coupling efficiency.

The optical semiconductor assembly normally has a sealed package structure. FIG. 9 shows an example of a conventional optical semiconductor assembly which has the package structure. In FIG. 9, the optical semiconductor element 1 is mounted on a chip carrier 14a which is made of copper, for example. The chip carrier 14a is mounted on a mount 21e which is made of SUS, for example, by solder, brazing or the like. A penetrating hole 23e-1 is formed in a central portion of a lens holder 23e, and the lens 2 is press fit within the penetrating hole 23e-1. Threads are formed on an outer peripheral portion of the lens holder 23e, and the lens 2 can be adjusted in the Z-axis direction because the lens holder 23e meshes with a support member 28.

The lens holder 23e and the support member 28 are both made of SUS. After the relative position of the lens 2 with respect to the optical semiconductor element 1 is adjusted in the X-axis and Y-axis directions, the support member 28 is supported by a tool and is laser welded on the mount 21e by use of a YAG laser. The adjustment of the lens 2 in the Z-axis direction is made by turning the lens holder 23e to the right or left within the support member 28 as described above.

The optical semiconductor assembly 7 which has the optical semiconductor element 1 and the lens 2 which are integrally fixed is fixed on a Peltier element 29 by a soldering, for example. That is, a metallized ceramic substrate 30 of the Peltier element 29 is fixed on the mount 21e by a soldering. After a ceramic substrate 31 of the Peltier element 29 is metallized, the metallized ceramic substrate 31 is fixed by a soldering on a glass terminal base 32 which is made of KOVAR or the like, for example. Terminals 33 are provided for supplying a driving current to the optical semiconductor element 1 and the Peltier element 29.

After the optical semiconductor assembly 7 is mounted on the Peltier element 29 as described above, the optical semiconductor assembly 7 is sealed by a packaging to protect the optical semiconductor element 1 from moisture. In other words, a cap 34 is welded on the glass terminal base 32 by a resistance welding in a state where an inert gas such as nitrogen gas is sealed therein, and the optical semiconductor package is obtained. The cap 34 is made of KOVAR, for example, and a glass window 35 which is made of a sapphire glass or the like is formed in a central portion of the cap 34 for injecting a laser beam.

In the optical semiconductor package structure described above, the optical semiconductor assembly 7 is soldered to the Peltier element 29, the Peltier element 29 is soldered to the glass terminal base 32, and the cap 34 is thereafter fixed to the glass terminal base 32 by a resistance welding. However, according to this structure, each member is fixed on top of another in the form of a stacked structure. Hence, the outgoing angle of the light beam after the packaging becomes greater than the outgoing angle of light from the optical semiconductor assembly 7, and there is a problem in that the optical coupling efficiency becomes extremely poor when this optical semiconductor package is formed into a module by assembling it to the optical isolator and the optical fiber assembly. That is, as shown in FIG. 10, a desired outgoing angle of light is denoted by a, but the outgoing angle of light from the optical semiconductor assembly 7 is slightly offset as indicated by b. After the packaging, there is a problem in that the offset quantity becomes large and the outgoing angle of light becomes as indicated by c. The offset is caused by the deviation of the optical axis which occurs due to the thermal stress and the like when the packaging is made and after the packaging is made.

The problems of the conventional examples described above can be summarized as follows. In other words, in the conventional examples shown in FIGS. 3, 5, 7 and 8, there is a problem in that the relative positions of the optical semiconductor element 1 and the lens 2 deviates due to the thermal shrinkage of the laser welded portions. In addition, in the conventional examples shown in FIGS. 4 and 6, there is a problem in that the relative positions of the optical semiconductor element 1 and the lens 2 deviates due to the creeping phenomenon after the solder hardens. Furthermore, when the packaging of the optical semiconductor assembly 7 is made, the structure becomes a stacked structure in which each rectangular member is stacked on top of another, and there is a problem in that the outgoing angle of the light beam after the packaging deviates from a design value.

DISCLOSURE OF THE INVENTION

The object of the present invention is to provide an optical semiconductor device which comprises a mount for holding an optical semiconductor element, a lens holder which holds a lens for converting a beam shape of a light emitted from the optical semiconductor element and is fixed to the mount, and a location for shrinking by laser irradiation which is provided at least on one of the mount and the lens holder, and a production method thereof. The relative positions of the optical semiconductor element and the lens are positively adjustable in any desired direction by a laser irradiation on the location for shrinking by laser irradiation. According to the present invention, it is possible to finely adjust the relative positions of the optical semiconductor element and the lens in any desired direction.

Another object of the present invention is to provide an optical semiconductor device which comprises a mount for holding an optical semiconductor element, a lens holder which holds a lens for converting a beam shape of a light emitted from the optical semiconductor element and is fixed to the mount, a location for shrinkage by laser irradiation which is provided at least on one of the mount and the lens holder, a package structure for sealing the mount and the lens holder, and a laser irradiation window provided in the package structure, and a production method thereof. The relative positions of the optical semiconductor element and the lens are positively adjustable in any desired direction by a laser irradiation on the the location for shrinkage by laser irradiation through the laser irradiation window. According to the present invention, it is possible to adjust the relative positions of the optical semiconductor element and the lens in any desired direction even after the packaging is made.

Further, these objects and features of the present invention will be apparent from the following description when read in conjunction with the accompanying drawings.

BRIEF DESCRIPTION OF THE DRAWINGS

FIGS. 4, 5, 6, 7 and 8 are cross sectional views of prior art optical semiconductor assemblies;

FIGS. 14A and 14B respectively are a partial cross sectional view and a plan view of a third embodiment of the optical semiconductor device according to the present invention;

FIG. 15 is a diagram for explaining the principle of the third embodiment;

FIGS. 19A and 19B respectively are a partial cross sectional view and a plan view of a sixth embodiment of the optical semiconductor device according to the present invention;

FIGS. 20A and 20B respectively are plan views for explaining the principle of the sixth embodiment;

DETAILED DESCRIPTION OF THE PREFERRED EMBODIMENTS

Figure 1:
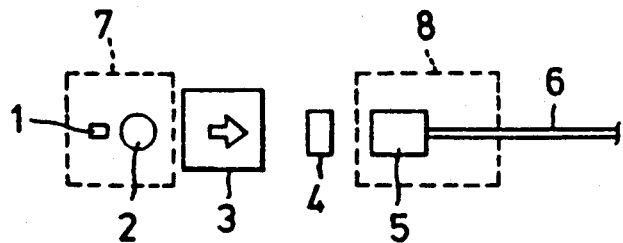
FIG. 1 is a schematic diagram showing an example of a prior art optical semiconductor module.
Figure 2:
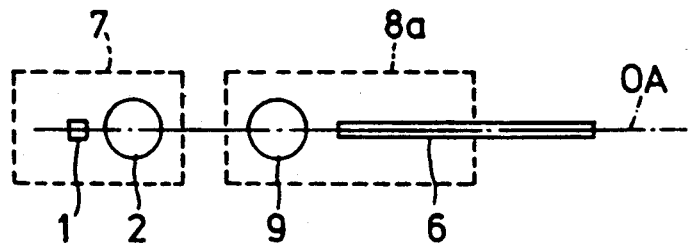
FIG. 2 is a schematic diagram showing another example of a prior art optical semiconductor module.
Figure 3:
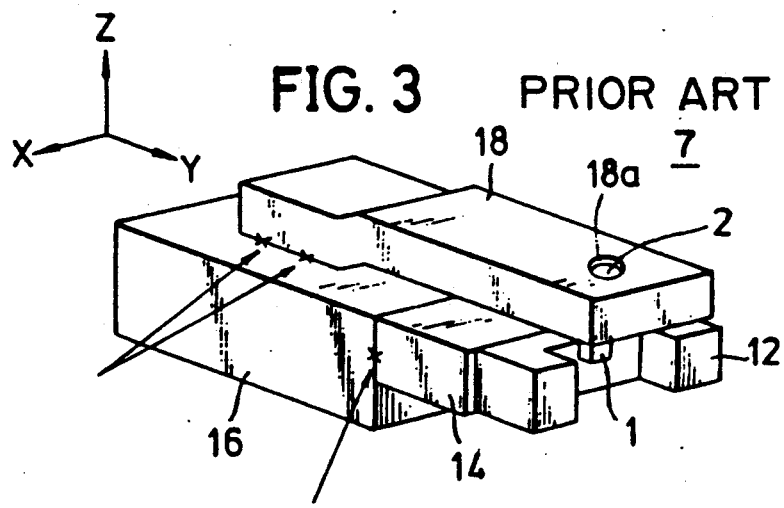
FIG. 3 is a perspective view of a prior art optical semiconductor assembly.
Figure 4:
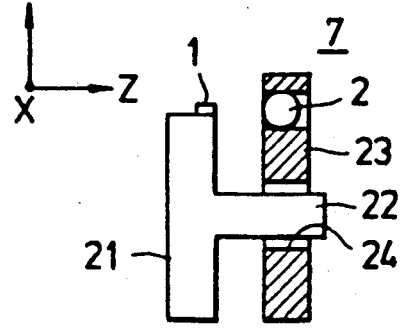
Figure 9:
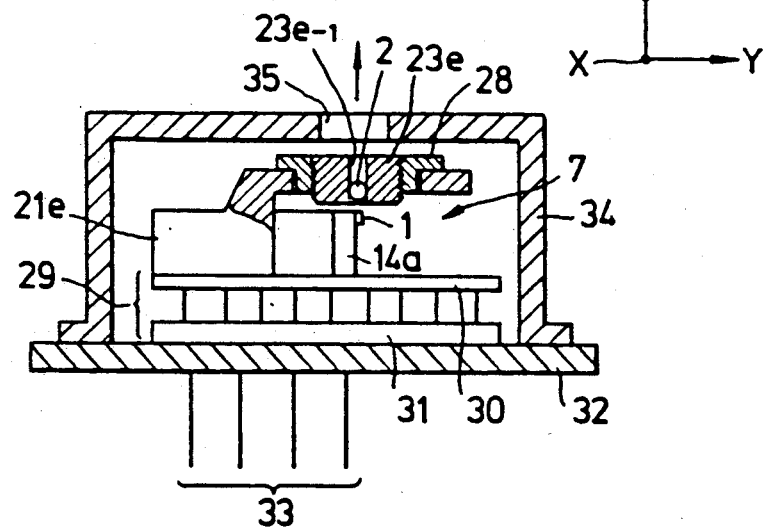
FIG. 9 is a cross sectional view of a prior art optical semiconductor assembly having the form of a package.
Figure 10:
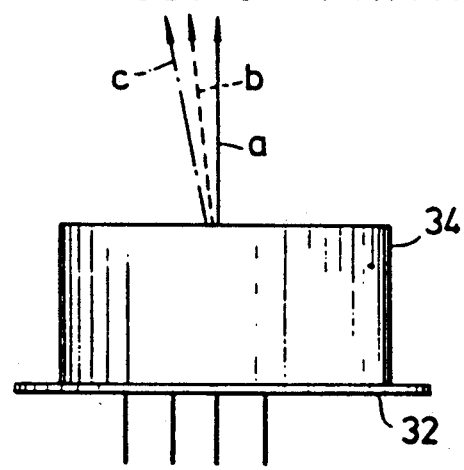
FIG. 10 is a diagram for explaining the problems of the optical semiconductor assembly shown in FIG. 9 having the form of the package.
Figure 11:
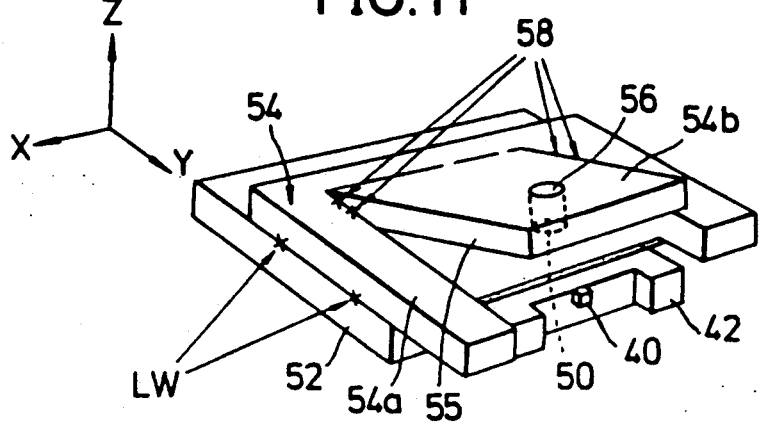
FIG. 11 is a perspective view of a first embodiment of an optical semiconductor device according to the present invention.

FIG. 11 shows an optical semiconductor assembly as a first embodiment of the optical semiconductor device according to the present invention. In FIG. 11, a laser diode chip 40 which is used as the optical semiconductor element is supplied in a state placed on a chip carrier 42 made of copper, for example. The chip carrier 42 is fixed on a SUS base 52 by a soldering. A lens holder 54 is made of SUS and comprises a base portion 54a and a raised portion 54b which is raised with respect to the base portion 54a by the provision of two slits 55. A fitting hole 56 is provided in the raised portion 54b, and a lens 50 is press fit within the fitting hole 56. The raised portion 54b is raised by a quantity such that the distance between the laser diode chip 40 and the lens 50 is slightly greater than the desired distance. After the position of the lens 50 is adjusted with respect to the laser diode chip 40 in the X-axis and Y-axis directions, the lens holder 54 is fixed to the mount 52 by a laser welding by use of a YAG laser as indicated by LW.

By the above described steps, the laser diode chip 40 and the lens 50 are fixed to form an integrated structure, but the distance between the laser diode chip 40 and the lens 50 in the Z-axis direction is set slightly greater than the desired distance as described above. In order to adjust the distance in the Z-axis direction, the YAG laser is irradiated on locations for shrinkage by laser irradiation 58 which are provided at base portions of the slits 55 of the lens holder 54. A shrinkage takes place when the locations which are melted by the laser irradiation harden, thereby drawing the raised portion 54b of the lens holder 54 downwardly. By appropriately selecting the laser power, the irradiating position of the defocus quantity (that is, the locations for shrinkage by laser irradiation 58 which are irradiated by the YAG laser) and the number of times of the irradiation, it is possible to adjust the distance between the laser diode chip 40 and the lens 50 to become an optimum value. Accordingly, it is possible to adjust the distance between the laser diode chip 40 and the lens 50 in the Z-axis direction to the optimum value with a high accuracy.

Figure 12:
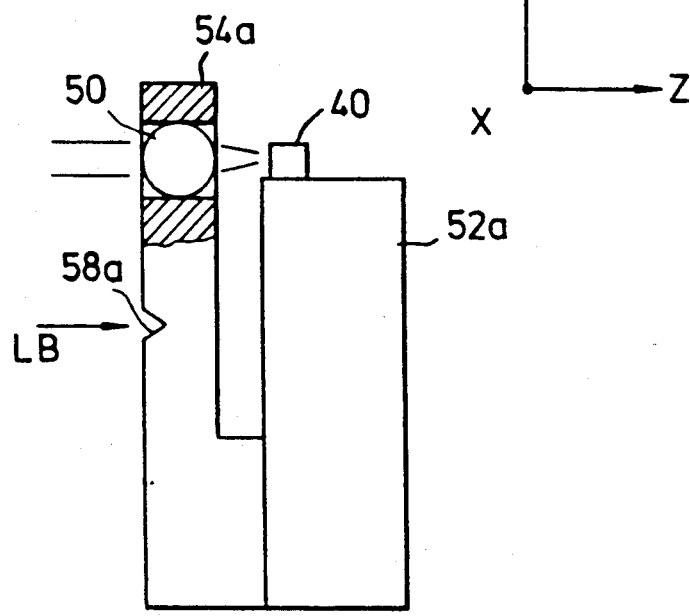
FIG. 12 is a partial cross sectional view of a second embodiment of the optical semiconductor device according to the present invention.

FIG. 12 shows an optical semiconductor assembly as a second embodiment of the optical semiconductor device according to the present invention. In FIG. 12, those parts which are essentially the same as those corresponding parts in FIG. 11 are designated by the same reference numerals, and a description thereof will be omitted.

In FIG. 12, a mount 52a which holds the optical semiconductor element 40 and a lens holder 54a which holds the lens 50 are fixed integrally to constitute the optical semiconductor assembly. A groove 58a which is used as the location for shrinkage by laser irradiation is provided on the lens holder 54a.

By irradiating a laser beam LB on the groove 58a and partially melting and solidifying the groove 58a of the lens holder 54, the the solidified portion so as to adjust the relative positional relationship of the optical semiconductor element 40 and the lens 50.

Figure 13A:
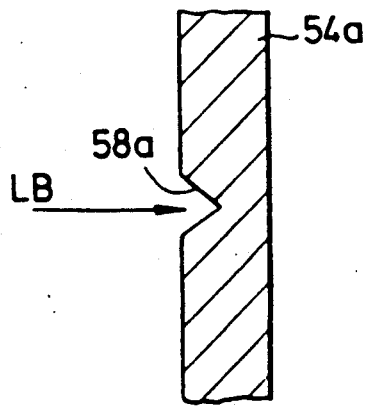
FIGS. 13A and 13B respectively are diagrams for explaining the principle of the second embodiment.
Figure 13B:
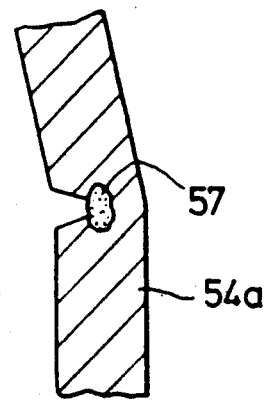

FIGS. 13A and 13B are diagrams for explaining the principle of this embodiment. When adjusting the relative positions of the optical semiconductor element 40 and the lens 50, the lens holder 54a partially melt beam LB is irradiated as shown in FIG. 13A on the groove 58a which is provided on the lens holder 54a. As shown in FIG. 13B, a shrinking force acts on a solidified portion 57 and the lens holder 54a thus bends towards the side formed with the groove 58a. The quantity of corresponds 1:1 to the distance between the optical semiconductor element 40 and the lens 50, and it is possible to obtain a desired relative positional relationship of the optical semiconductor element 40 and the lens 50 depending on the irradiation condition of the laser beam LB.

Next, a description will be given of a third embodiment of the optical semiconductor device according to the present invention, by referring to FIGS. 14A and 14B. In FIGS. 14A and 14B, those parts which are essentially the same as those corresponding parts in FIG. 12 are designated by the same reference numerals.

In FIGS. 14A and 14B, the optical semiconductor element 40 is a semiconductor laser chip or the like and is fixed in a depression 60a by a soldering through a Au layer which is not shown, for example. The depression 60a is formed in an upper portion of a heat sink 60 which is made of Cu or the like having a satisfactory thermal conductance. The heat sink 60 is fixed on an upper end of a mount 52 which is made of a SUS material by a brazing, for example. The lens 50 is a spherical lens or the like. For example, the lens 50 is press fit within a hole 54aA in the lens holder 54a. The lens holder 54a is integrated to the mount 52a at a lower end portion 54aB by a laser welding, for example. A plurality (a total of 8 in this embodiment) of grooves 58a are formed on the lens holder 54a on the side of the mount 52a and on the surface on the other side by a cutting process, for example.

A description will be given of the adjustment of the relative positions of the optical semiconductor element 40 and the lens 50 of the optical semiconductor assembly which has the above described construction in the direction of the optical axis, that is, the Z-axis direction. It is assumed that the adjustment of the relative positions in the X-axis and Y-axis directions which are perpendicular to the optical axis is roughly made when integrating the mount 52a and the lens holder 54a. First, as shown in FIG. 15, an arbitrary groove 58aA of the lens holder 54a is melted by irradiating the laser beam thereon out of the grooves 58a which are formed on the lens holder 54a on the side of the mount 52a and on the opposite side. When the irradiation of the laser beam is stopped, a shrinking force acts on the solidified portion because the metal composition changes and the like, and the lens holder 54a is bent and deformed as indicated by a phantom line in FIG. 15. An approximate displacement d of the lens 50 in the optical axis direction Z can be set arbitrarily depending on the power of the laser beam, the irradiation time and the spot diameter (defocus quantity). For example, it is possible to fix the lens 50 at a desired position while monitoring the shape of the beam emitted from the optical semiconductor element 40 via the lens 50. When the displacement of the lens 50 made by the above operation is too large, the laser beam is irradiated on an arbitrary groove 58aB of the lens holder 54a out of the grooves 58a which are formed on the side of the mount 52a so as to displace the lens in the opposite direction. In this case, the laser beam may be irradiated obliquely to the lens holder 54a by avoiding the mount 52a or by through a hole which is not shown and is provided beforehand in the mount 52a. Even when the relationship between the irradiation condition of the laser beam and the displacement of the lens 50 is not clear, it is possible to converge the position of the lens 50 to the optimum position by repeatedly irradiating the laser beam on both sides of the lens holder 54a. The groove portion is melted by the irradiation of the laser beam because the lens holder 54a can be partially melted by the instantaneous heat and the creeping phenomenon with age is relatively small in the solidified portion.

Figure 16:
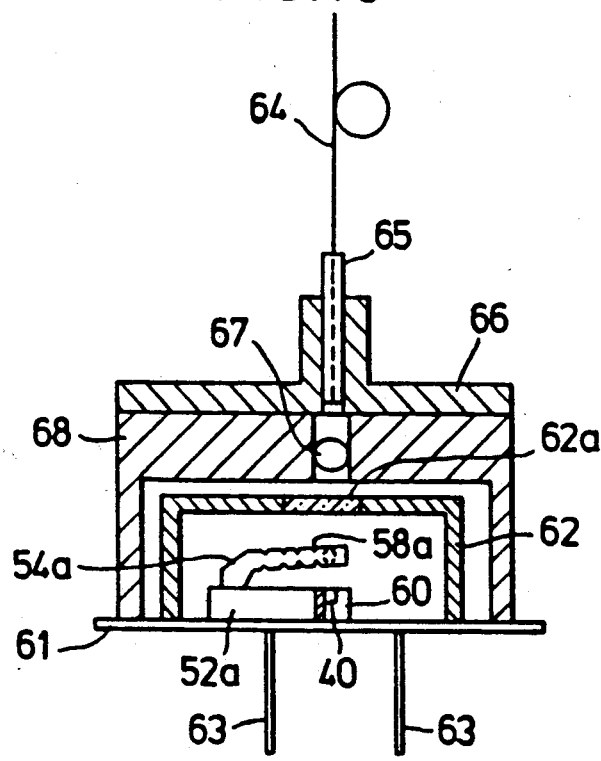
FIG. 16 is a cross sectional view of a fourth embodiment of the optical semiconductor device according to the present invention.

FIG. 16 shows an optical semiconductor module as a fourth embodiment of the optical semiconductor device according to the present invention. For example, this optical semiconductor module is constituted using the optical semiconductor assembly shown in FIGS. 14A and 14B in which the adjustment of the relative positions of the optical semiconductor element and the lens is completed. The mount 52a of the optical semiconductor assembly is fixed to a stem 61. In order to provide an airtight sealing of the optical semiconductor element 40, a cap 62 which has a glass window 62a is mounted on the stem 61. Terminals 63 are provided for applying a driving voltage to the optical semiconductor element 40. On the other hand, the fiber assembly is made by fixedly inserting an optical fiber 64 into a ferrule 65, fixedly inserting the ferrule 65 into a flange 66, and integrating the flange 66 to a lens holder 68 which is fixedly inserted with a lens 67.

In this kind of optical semiconductor module, the alignment adjustment (adjustment of the relative positions in the X-axis and Y-axis directions which are perpendicular to the optical axis Z) between the assemblies in the module assembling stage can be made with ease by making a position adjustment prior to fixing the stem 61 and the lens holder 69. However, the focus adjustment is not easy in the module assembling stage. Hence, compared to the alignment adjustment, the focus adjustment in each assembling stage must be made with a sufficiently high accuracy. In this embodiment, the focus adjustment of the optical semiconductor assembly can be made with ease by irradiating the laser beam on the groove 58a. In addition, the focus adjustment of the fiber assembly can also be made with ease by adjusting the inserting position of the ferrule 65. As a result, it is possible to obtain a high optical coupling efficiency by merely making the alignment adjustment between each of the assemblies in the module assembling stage. In addition, the optical coupling efficiency will not change with time because there is no fixed parts using filling materials in this embodiment.

Figure 17A:
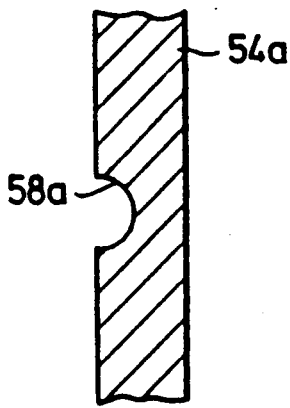
FIGS. 17A and 17B respectively are cross sectional views of essential parts of modifications of the second and third embodiments.

FIG. 17A shows an essential part of a modification of the second embodiment. In this modification, the shape of the groove 58a is a U-shape and not a V-shape as in the second embodiment. Of course, the shape of the groove 58a may be other than the V-shape and the U-shape.

Figure 17B:
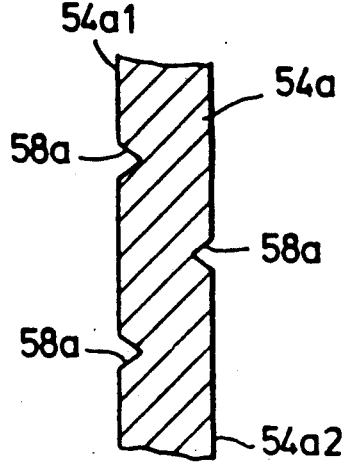

FIG. 17B shows an essential part of a modification of the third embodiment. In this modification, the position of the groove 58a which is provided in a first surface 54a1 of the lens holder 54a and the groove 58a which is provided in a second surface 54a2 differ in the Z-axis direction. Of course, it is not essential that the grooves 58a are provided periodically on the lens holder 54a.

Furthermore, the groove which is used as the laser irradiation part may be provided in the mount 52a. It is also possible to provide the groove in both the lens holder 54a and the mount 52a.

Figure 18A:
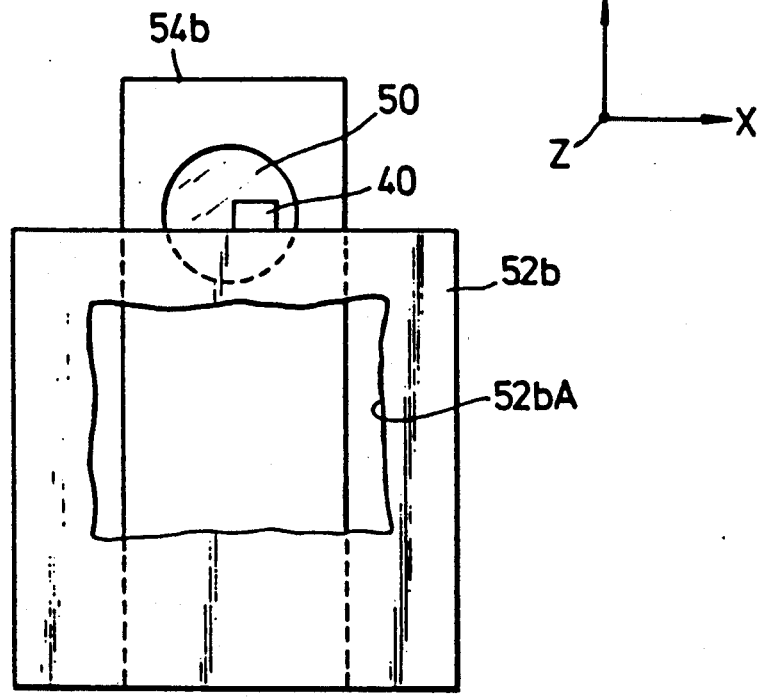
FIGS. 18A and 18B respectively are plan views of an essential part for explaining the principle of a fifth embodiment of the optical semiconductor device according to the present invention.
Figure 18B:
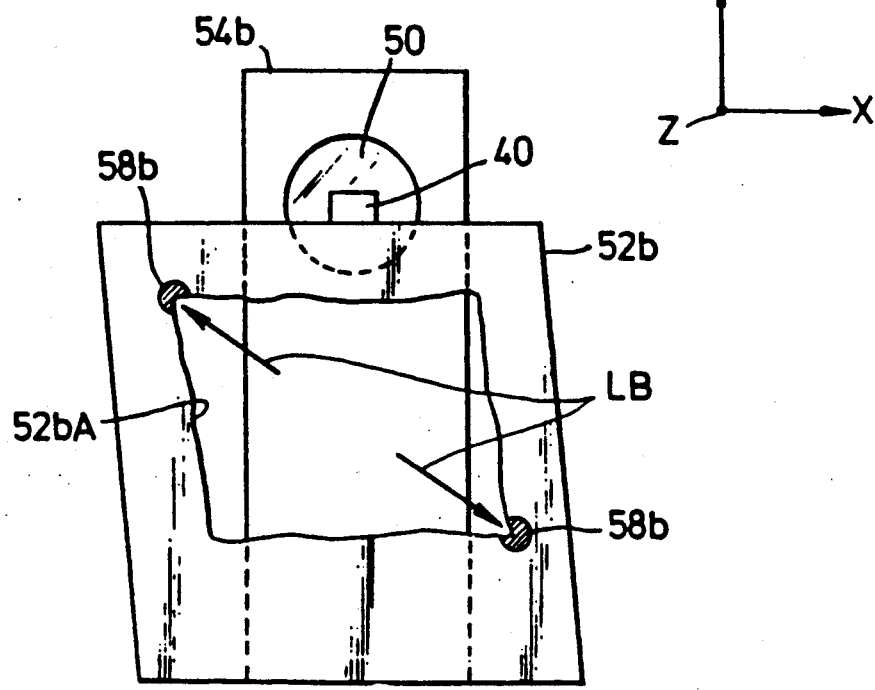

Next, a description will be given of an optical semiconductor assembly as a fifth embodiment of the optical semiconductor device according to the present invention in conjunction with FIGS. 18A and 18B. In FIGS. 18A and 18B, those parts which are essentially the same as those corresponding parts in FIG. 11 are designated by the same reference numerals. As shown in FIG. 18A, the optical semiconductor assembly integrally comprises a mount 52b which holds the optical semiconductor element 40 and a lens holder 54b which holds the lens 50. A hole 52bA penetrates the mount 52b in the direction of the optical axis Z (direction perpendicular to the paper).

As shown in FIG. 18B, the relative positional relationship of the optical semiconductor element 40 and the lens 50 is adjusted by irradiating the laser beam LB within the hole 52bA to partially melt and solidify laser irradiation parts 58b of the mount 52b. In this embodiment, the mount 52b is provided with the hole 52bA, but it is possible to similarly provide a hole in the lens holder 54b. In addition, such a hole may be provided in both the mount 52b and the lens holder 54b. Furthermore, the shape of the hole 52bA may be set arbitrarily as long as it has a corner.

When adjusting the relative positions of the optical semiconductor element 40 and the lens 50, the laser beam LB is irradiated on the inside of the hole 52bA which is provided in the mount 52b as shown in FIG. 18B. The mount 52b partially melts and then solidifies. Because a shrinking force acts on the laser irradiation parts 58b, the mount 52b is deformed. When the mount 52b is deforms, the optical semiconductor element 40 is displaced with respect to the lens 50 in the X-axis and Y-axis directions which are perpendicular to the optical axis Z depending on the deformation quantity of the mount 52b. This displacement corresponds 1:1 to the deformation quantity of the mount 52b, and in addition, the deformation quantity of the mount 52b is determined depending on the material constituting the mount 52b, the volume of the laser irradiation parts 58b and the like. Accordingly, by selecting an appropriate material such as SUS, KOVAR and the like for the mount 52b and adjusting the irradiation condition of the laser beam LB, it is possible to obtain a desired relative positional relationship of the optical semiconductor element 40 and the lens 50.

FIGS. 19A and 19B show an optical semiconductor assembly as a sixth embodiment of the optical semiconductor device according to the present invention. In FIGS. 19A and 19B, those parts which are essentially the same as those corresponding parts in FIGS. 14A and 14B are designated by the same reference numerals. The optical semiconductor element 40 is a semiconductor laser chip or the like and is fixed in the depression 60a by a soldering through a Au layer which is not shown, for example. The depression 60a is formed in the upper portion of the heat sink 60 which is made of Cu or the like having a satisfactory thermal conductance. The heat sink 60 is fixed on an upper end of a mount 52c which is made of a SUS material by a brazing, for example. The lens 50 is a spherical lens or the like. For example, the lens 50 is press fit within a hole 54cA in a lens holder 54c. The lens holder 54c is integrated to the mount 52c at a lower end portion 54cB. In this embodiment, an oblong hole 52cA penetrates the mount 52c in the direction of the optical axis Z.

When integrating the mount 52c and the lens holder 54c by a laser welding, it is possible to obtain a sufficient fixing strength by irradiating the laser beam LB only generally in the X-axis direction as indicated by arrows in FIG. 19B. In this case, the relative positional relationship of the optical semiconductor element 40 and the lens 50 will not deviate in the Y-axis direction, and the readjustment need only be made with respect to the X-axis direction.

Figure 21:
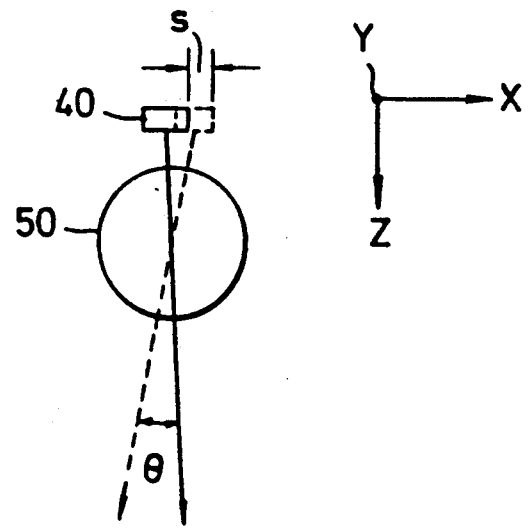
FIG. 21 is a diagram for explaining the principle of the sixth embodiment.

A description will be given of the adjustment of the relative positions in the X-axis direction. In FIG. 20A, when attempting to displace the optical semiconductor element 40 in the -X direction, the laser beam LB is irradiated locations for shrinkage by laser irradiation 58c1 and 58c3. Out of locations for shrinkage by laser irradiation 58c1 through 58c4 which are provided the four corners of the hole 52cA in the mount 52c, the location for shrinkage by laser irradiation 58c1 to the optical semiconductor element 40 is located close to the optical semiconductor element 40 on the side of the −X direction and the location for shrinkage by laser irradiation 58c3 is located far from the optical semiconductor element 40 on the side of the +X direction. In this case, a vertical angle A of the the location for shrinkage by laser irradiation 58c1 changes to A' which is smaller than A as shown in FIG. 20B and a vertical angle C of the the location for shrinkage by laser irradiation 58c3 also similarly changes to C' which is smaller than C. As a result, the optical semiconductor element 40 is displaced by s in the −X direction depending on this change. When the optical semiconductor element 40 is displaced by s, the direction of the emitted beam becomes inclined by an angle $\theta$ which corresponds to s on the XZ plane as shown in FIG. 21, and the alignment can thus be readjusted. This inclination quantity $\theta$ can be set arbitrarily depending on the power of the irradiated laser beam LB, the irradiation time and the spot diameter (defocus quantity). Hence, the optical semiconductor element 40 can be fixed to the desired position while detecting the direction of the beam which is emitted from the optical semiconductor element 40 through the lens 50.

When the displacement of the optical semiconductor element 40 is too large as a result of the above operation, the laser beam LB is irradiated on the locations for shrinkage by laser irradiation 58c2 and 58c4 out of the locations for shrinkage by laser irradiation 58c1 through 58c4 which are located at the hole 52cA of the mount 52c, excluding the locations for shrinkage by laser irradiation 58c1 and 58c3. In this case, the optical semiconductor element 40 is displaced in the opposite direction by an action similar to that described above. Therefore, even when the relationship between the irradiation condition of the laser beam LB and the displacement of the optical semiconductor element 40 is not clear, it is possible to converge the position of the optical semiconductor element 40 to the optimum position by repeatedly irradiating the laser beam LB on the diametric corners of the hole 52cA. The corner of the hole 52cA is melted by the irradiation of the laser beam LB because the mount 52c can be partially melted by the instantaneous heat.

Figure 22:
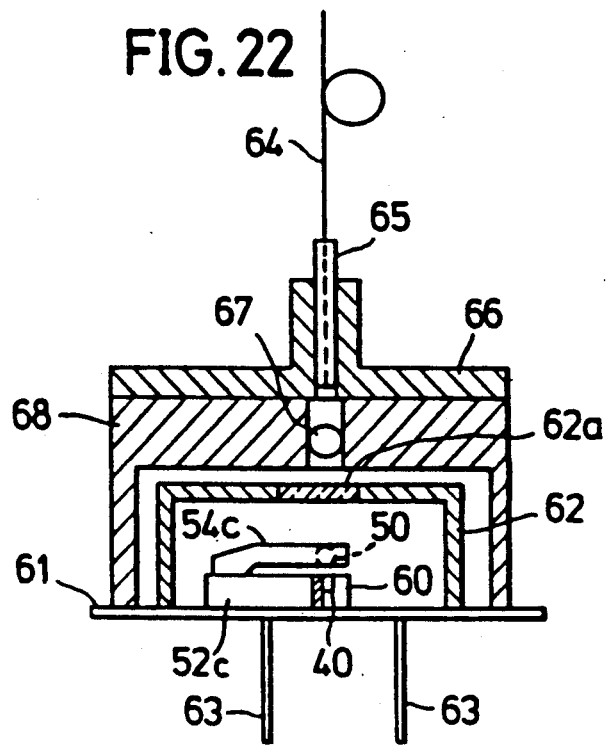
FIG. 22 is a cross sectional view of a seventh embodiment of the optical semiconductor device according to the present invention;, FIGS. 23A and 23B respectively are a perspective view and a cross sectional view of essential parts of an eighth embodiment of the optical semiconductor device according to the present invention.

FIG. 22 shows an optical semiconductor module as a seventh embodiment of the optical semiconductor device according to the present invention. For example, this optical semiconductor module is constituted by use of the optical semiconductor assembly shown in FIGS. 19A and 19B in which the adjustment of the relative positions of the optical semiconductor element 40 and the lens 50 is completed. The mount 52c of the optical semiconductor assembly is fixed to the stem 61. In order to provide an airtight sealing of the optical semiconductor element 40, the cap 62 which has the glass window 62a is mounted on the stem 61. The terminals 63 are provided for applying a driving voltage to the optical semiconductor element 40. On the other hand, the fiber assembly is made by fixedly inserting the optical fiber 64 into the ferrule 65, fixedly inserting the ferrule 65 into the flange 66, and integrating the flange 66 to the lens holder 68 which is fixedly inserted with the lens 67.

In this kind of optical semiconductor module, the alignment is adjusted in the optical semiconductor assembly and the fiber assembly so that the respective optical axes Z become parallel, for example. In the module assembling stage, it is possible to easily obtain a high optical coupling efficiency by merely adjusting the position of each assembly in the X-axis and Y-axis directions which are perpendicular to the optical axis Z.

Figure 23A:
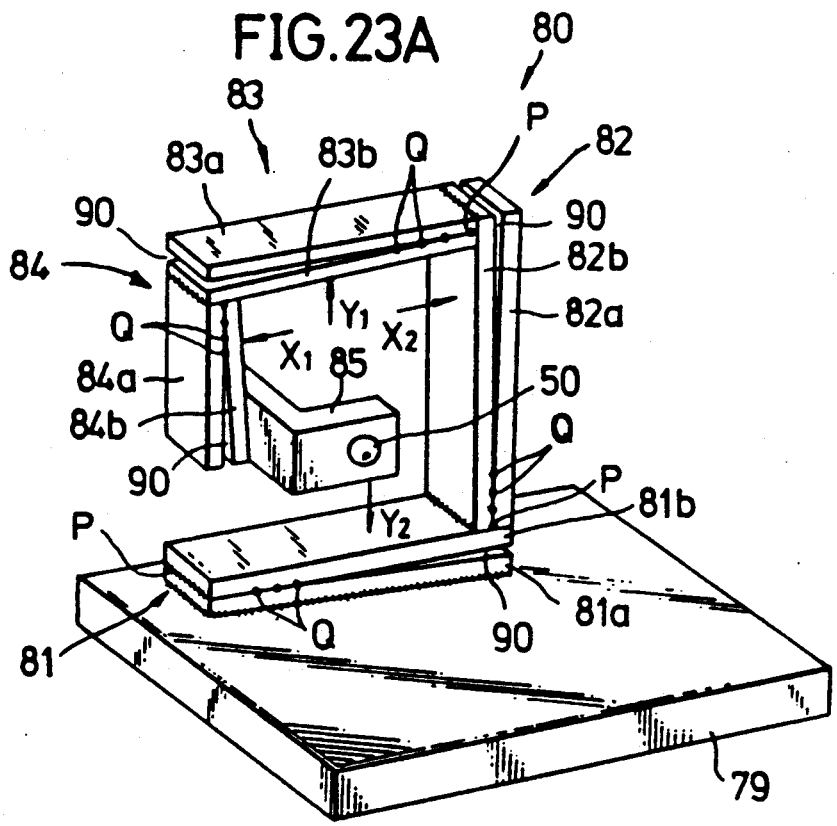
Figure 23B:
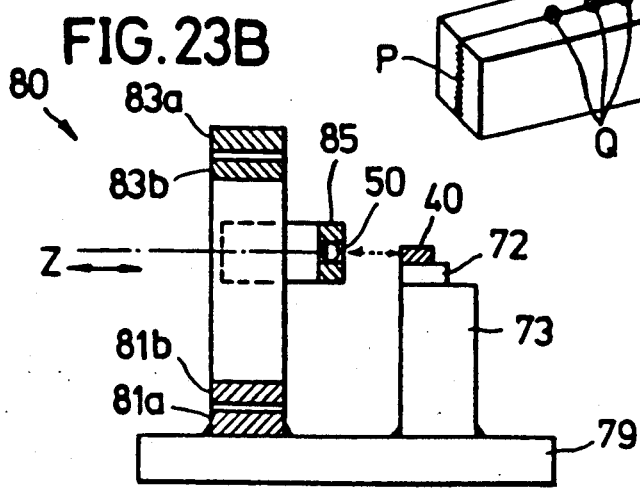

Next, a description will be given of an eighth embodiment of the optical semiconductor device according to the present invention in conjunction with FIGS. 23A and 23B. In FIGS. 23A and 23B, a base 73 has the shape of a rectangular prism and is made of a stainless steel, for example. The base 73 is fixed vertically on the surface of a substrate 79 which is made of a stainless steel or the like by a laser welding. The optical semiconductor element 40 is mounted on a mounting substrate 72 which is provided on an upper surface of the base 73.

An approximately rectangular frame shaped lens assembly 80 is provided on the substrate 79 so that the lens 50 closely confronts the optical semiconductor element 40 with a predetermined distance formed therebetween. The lens assembly 80 comprises a first horizontal element joined plate pair 81, a first vertical element joined plate pair 82, a second horizontal element joined plate pair 83, a second vertical element joined plate pair 84, and a lens holder 85 which has a penetrating hole in which the lens 50 is press fit. Each of the element joined plate pairs 81 through 84 have a construction which is shown in detail in FIG. 24.

Figure 24:
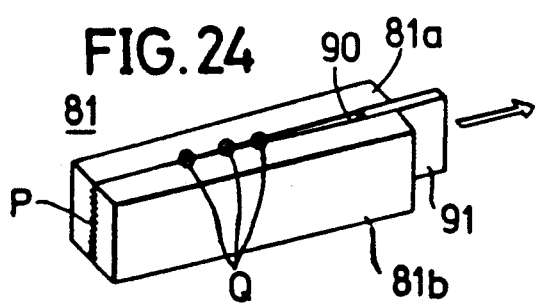
FIG. 24 is a perspective view of an element joined plate pair in the eighth embodiment.

FIG. 24 shows as an example the first horizontal element joined plate pair 81. Short plates 81a and 81b are element plates of identical shape and dimension. For example, the short plates 81a and 81b are made of a stainless steel or the like and have a small thickness and an oblong shape to facilitate the laser welding.

The pair of short plates 81a and 81b are overlapped with one end in contact with each other. A spacer 91 having a thickness in the order of 80 microns, for example, is sandwiched between the short plates 81a and 81b on the other end. In this state, a contact surface P is fixed by a laser welding to form a connected end. Thereafter, the spacer 91 is removed, and a gap in the order of 80 microns is formed as an open end 90 at the end opposite to the connected end. When a laser welding is made on the confronting surfaces of the element joined plate pair 81 at locations for shrinkage by laser irradiating Q, the locations for shrinkage by laser irradiated Q shrink to make the end portions of the open end 90 close upon each other. As the locations for shrinkage by laser irradiating Q approaches near the open end 90, the gap of the open end 90 becomes smaller. In the case where the initial gap is in the order of 80 microns, the adjustable range of the gap at the open end 90 is 10 microns to 70 microns.

The three element joined plate pairs, namely, the first horizontal element joined plate pair 81, the first vertical element joined plate pair 82 and the second horizontal element joined plate pair 83 have approximately the same length. The second vertical element joined plate pair 84 has a length which is approximately one-half that of the first vertical element joined plate pair 82. These four element joined plate pairs having the above structure are assembled as shown in FIG. 23A.

In FIG. 23A, the first horizontal element joined plate pair 81 is fixed to the substrate 79 by making the outer side surface of one short plate 81a of the first horizontal element joined plate pair 81 contact the substrate 79 and laser welding the contact portion. The first vertical element joined plate pair 82 is fixed vertically to the first horizontal element joined plate pair 81 to be vertical to the substrate 79 by laser welding the connected end of the first vertical element joined plate pair 82 to the side surface of the short plate 81b of the first horizontal element joined plate pair 81 on the side of the open end 90. The second horizontal element joined plate pair 83 is fixed vertically to the first vertical element joined plate pair 82 to confront the first horizontal element joined plate pair 81 and to be parallel to the substrate 79 by laser welding the connected end of the second horizontal element joined plate pair 83 to the side surface of a short plate 82b of the first vertical element joined plate pair 82 on the side of the open end 90. The second vertical element joined plate pair 84 is fixed vertically downward from the second horizontal element joined plate pair 83 to be parallel to the first vertical element joined plate pair 82 by laser welding the connected end of the second vertical element joined plate pair 84 to the side surface of a short plate 83b of the second horizontal element joined plate pair 83 on the side of the open end 90.

The lens holder 85 is made of a stainless steel and has an L-shape in the plan view. The lens holder 85 has a penetrating hole which is provided at a position confronting the optical semiconductor element 40 when the lens assembly 80 is arranged. The lens 50 is press fit within the penetrating hole. The lens holder 85 is fixed to the side surface of one short plate 84b of the second vertical element joined plate pair 84 on the side of the open end 90 by a laser welding so that the optical axis Z of the lens 50 penetrates horizontally within the frame which is constituted by the four element joined plate pairs 81 through 84. The lens assembly 80 having the above construction is laser welded on the substrate 79 so that the lens 50 confronts the optical semiconductor element 40 which is provided on the base 73.

In the case where the optical semiconductor element 40 is a semiconductor laser, the entire peripheral edge of the lower short plate 81a of the first horizontal element joined plate pair 81 is fixed to the substrate 79 by a laser welding at a position where the optical power becomes a maximum by moving the lens assembly 80 up, down, right and left while measuring the optical power transmitted through the lens 50 on an optical power meter, a television camera or the like.

On the other hand, in the case where the optical semiconductor element 40 is a light receiving element, the lens assembly 80 is moved so that the photocurrent of the light which is converged by the convergent lens 50 and irradiated on the light receiving surface becomes a maximum, and the short plate 81a of the first horizontal element joined plate pair 81 is fixed on the substrate 79 by a laser welding.

After the lens assembly 80 is laser welded on the substrate 79, the lens 50 is minutely displaced from the set position due to the thermal distortion at the melted portion. For this reason, the shifted direction of the optical axis can be confirmed by manually closing the open ends 90 of the element joined plate pairs 81 through 84 while monitoring the optical power or the photocurrent, and the relative positions of the lens and the optical semiconductor element 40 are thereafter finely adjusted up, down, right and left by laser welding the confronting surfaces of the short plates of the selected element joined plate pairs.

For example, when the confronting surfaces of the short plates 81a and 81b of the first horizontal element joined plate pair 81 is laser welded at the laser irradiation part Q, the lens 50 minutely moves down in an arrow direction Y2. In addition, when the confronting surfaces of the short plates 82a and 82b of the first vertical element joined plate pair 82 is laser welded at the laser irradiation part Q, the lens 50 minutely moves horizontally in an arrow direction X2.

When the confronting surfaces of the short plates 83a and 83b of the second horizontal element joined plate pair 83 is laser welded at the laser irradiation part Q, the lens 50 minutely moves up in an arrow direction Y1. In addition, when the confronting surfaces of the short plates 84a and 84b of the second vertical element joined plate pair 84 is laser welded at the location for shrinkage by laser irradiation Q, the lens 50 minutely moves horizontally in an arrow direction X1. In other words, it is possible to minutely move the lens 50 up, down, right and left (direction perpendicular to the optical axis Z).

Figure 25:
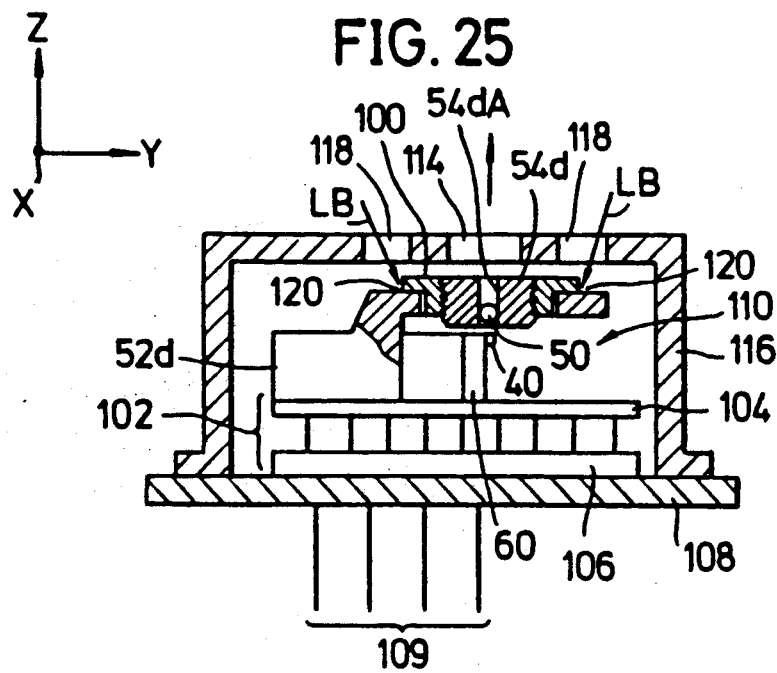
FIG. 25 is a cross sectional view of a ninth embodiment of the optical semiconductor device according to the present invention.

Next, a description will be given of an optical semiconductor package structure as a ninth embodiment of the optical semiconductor device according to the present invention in conjunction with FIG. 25. In FIG. 25, the laser diode chip 40 is used as the optical semiconductor element and is mounted on the chip carrier 60. The chip carrier 60 is fixed by a soldering to a mount 52d which is made of SUS, for example. A lens holder 54d has a fitting hole 54dA at a central portion and threads are formed on an outer peripheral portion. The lens 50 is press fit within the fitting hole 54dA. The lens holder 54d meshes a support member 100, and this structure makes it possible to adjust the lens 50 in the Z-axis direction. The lens holder 54d and the support member 100 are made of SUS. After the relative positions of the laser diode chip 40 and the lens 50 are adjusted in the X-axis and Y-axis directions, the support member 100 is held by a tool and fixed on the mount 52d by a laser welding using a YAG laser. Hence, which the laser diode chip 40 and the lens 50 are integrally fixed.

Figure 26:
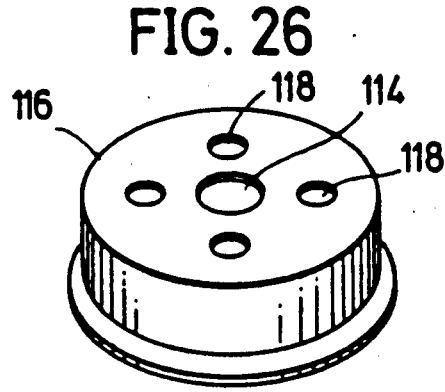
FIG. 26 is a perspective view showing a cap in the ninth embodiment.

When forming the optical semiconductor assembly 100 in the form of a package, a metallized ceramic substrate 104 of a Peltier element 102 is fixed on the mount 52d by a soldering. The Peltier element 102 is fixed by a soldering on a glass terminal base 108 which is made of KOVAR or the like after metallizing a ceramic substrate 106. Terminals 109 are provided for supplying a driving current to the laser diode chip 40 and the Peltier element 102. Thereafter, a cap 116 is welded on the glass terminal base 108 by a resistance welding in a state where an inert gas such as nitrogen gas is sealed therein so as to protect the laser diode chip 40 from moisture, and the optical semiconductor package is obtained. The cap 116 is made of KOVAR, for example. An annealing is made with respect to this optical semiconductor package. As in the case of the conventional structure, a glass window 114 for outgoing beam is provided at a central portion of the cap 116. As shown in FIG. 26, four glass windows 118 for laser irradiation are provided at positions surrounding the glass window 114. For example, these glass windows 114 and 118 are mounted on the cap 116 by a brazing after applying a non-reflective coating on both sides of a sapphire glass. The glass windows 114 and 118 are sufficiently transparent with respect to the light emitted from the laser diode chip 40 and the YAG laser.

In the optical semiconductor package which is assembled as described above, the outgoing angle after the package assembly is greater than the outgoing angle when the laser diode chip 40 and the lens 50 are temporarily fixed due to the crossing of parts, the thermal stress during the annealing and the like. The offset quantity from the desired angle of outgoing light is large. Hence, the YAG laser is irradiated on locations for shrinkage by laser irradiation 120 via the four glass windows 118 which are provided in the cap 116 as indicated by LB in FIG. 25, and the support member 100 is minutely moved on the mount 52d so as to adjust the outgoing light from the package to the desired angle. The laser power at the time of the position adjustment generally needs to be greater than that during the temporary fixing because the support member 100 must be moved by melting the laser locations for shrinkage by irradiation 120.

In FIG. 25, the optical semiconductor assembly which is formed in the form of the package is not limited to the optical semiconductor assembly 110. For example, it is of course possible to form the optical semiconductor assembly in each of the above described embodiments in the form of the package. But in this case, there is a need to provide the windows through which the laser irradiation is made at positions of the cap 116 where the laser irradiation on the locations for shrinkage by laser irradiation is possible. Accordingly, the windows through which the laser irradiation is made should be provided on the cap 116 depending on the positions of the locations for shrinkage laser irradiation which are provided on the optical semiconductor assembly.

Figures 27, 28:
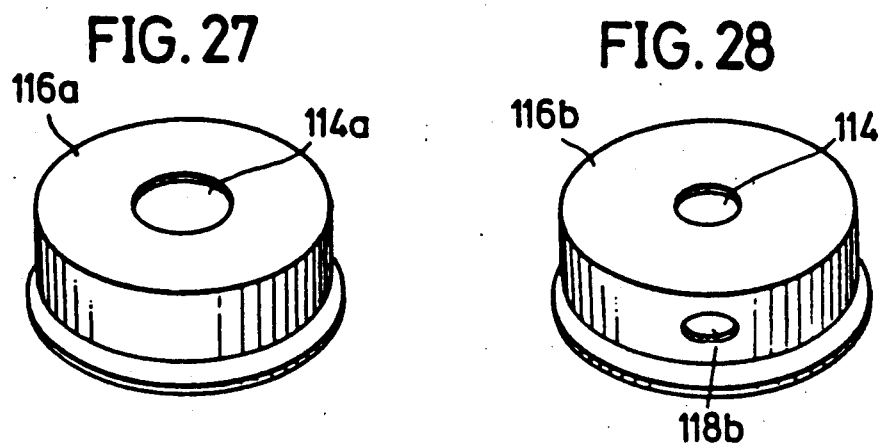
FIG. 27 is a perspective view showing a first modification of the cap.
FIG. 28 is a perspective view showing a second modification of the cap.

FIG. 27 shows a first modification of the cap. In a cap 116a shown in FIG. 27, a glass window 114a for the outgoing beam is used in common as the glass window for the laser irradiation.

FIG. 28 shows a second modification of the cap. In a cap 116b shown in FIG. 28, a glass window 118b for laser irradiation is provided on a side surface of the cap 116b.

The number and shape of windows which are provided for laser irradiation are of course not limited to those of the embodiments and modifications.

Further, the present invention is not limited to these embodiments, but various variations and modifications may be made without departing from the scope of the present invention.

As described above, the optical semiconductor device and production method thereof according to the present invention are extremely useful from the practical point of view in that the relative positions of the optical semiconductor element and the lens can be finely adjusted in any desired direction.

We claim:

1. An optical semiconductor device, comprising:
   a mount for holding an optical semiconductor element;
   a lens holder which holds a lens for converting a beam shape of light emitted from the optical semiconductor element and is fixed to said mount; and
   at least one location for shrinkage by laser irradiation provided on at least one of said mount and said lens holder, whereby relative positions of the optical semiconductor element and the lens are positively adjustable in any desired direction by laser irradiation on said location for shrinkage by laser irradiation.

2. The optical semiconductor device as claimed in claim 1, characterized in that said lens holder includes a raised portion which is defined by a pair of slits, said location for shrinkage by laser irradiation is provided at a base portion of said slits, and the relative positions of the optical semiconductor element and the lens are adjustable in a direction of an optical axis of the lens by laser irradiation on said location for shrinkage by laser irradiation.

3. The optical semiconductor device as claimed in claim 1, characterized in that said location for shrinkage by laser irradiation is a groove.

4. The optical semiconductor device as claimed in claim 3, characterized in that said groove has an approximate V-shape and is provided is said lens holder, and the relative positions of the optical semiconductor element and the lens are adjustable in a direction along an optical axis of the lens by laser irradiation on said location for shrinkage by laser irradiation.

5. The optical semiconductor device as claimed in claim 1, characterized in that there is further provided a hole which is provided in at least one of said mount and said lens holder and has a shape with a corner, said location for shrinkage by laser irradiation is provided at an arbitrary corner portion of said hole, and the relative positions of the optical semiconductor element and the lens are adjustable in a direction perpendicular to an optical axis of the lens by laser irradiation on said location for shrinkage by laser irradiation.

6. The optical semiconductor device as claimed in claim 1, characterized in that said lens holder comprises a plurality of plate pairs which are connected with each plate pair having plates which are connected at base portions thereof to form an approximate V-shape, said lens is fixed to one plate of an arbitrary plate pair, said location for shrinkage by laser irradiation is provided at a base portion of each plate pair, and the relative positions of the optical semiconductor element and the lens are adjustable in a direction perpendicular to an optical axis of the lens by laser irradiation on said location for shrinkage by laser irradiation.

7. The optical semiconductor device as claimed in claim 1, characterized in that there is further provided a package structure for sealing said mount and said lens holder, and said package structure has a window for laser irradiation provided at a portion in correspondence with said location for shrinkage by laser irradiation.

8. The optical semiconductor device as claimed in claim 7, characterized in that said window for laser irradiation is commonly used as a window for an outgoing light beam which is emitted from the optical semiconductor element.

9. An optical semiconductor device production method characterized in that there are included a first step of fixing a mount which holds an optical semiconductor element on a lens holder which holds a lens for converting a beam shape of light emitted from the optical semiconductor element, and a second step of irradiating a laser beam on at least one location for shrinkage by laser irradiation provided on at least one of said mount and said lens holder to positively adjust relative positions of the optical semiconductor element and the lens in any desired direction.

10. The optical semiconductor device production method as claimed in claim 9, characterized in that said first step adjusts the relative positions of the optical semiconductor element and the lens in a direction perpendicular to an optical axis of the lens and fixes said lens holder on said mount by laser welding, and said second step adjusts the relative positions of the optical semiconductor element and the lens in the direction of said optical axis by laser irradiation on said location for shrinkage by laser Irradiation.

11. The optical semiconductor device production method as claimed in claim 9, characterized in that said first step adjusts the relative positions of the optical semiconductor element and the lens in a direction of an optical axis of the lens and fixes said lens holder on said mount by a laser welding, and said second step adjusts the relative positions of the optical semiconductor element and the lens in a direction perpendicular to said optical axis by laser irradiation on said location for shrinkage by laser irradiation.

12. The optical semiconductor device production method as claimed in claim 9, characterized in that said lens holder includes a raised portion which is defined by a pair of slits, said location for shrinkage by laser irradiation is provided at a base portion of said slits, said first step adjusts the relative positions of the optical semiconductor element and the lens in a direction perpendicular to an optical axis of the lens and fixes said lens holder on said mount by a laser welding, and said second step adjusts the relative positions of the optical semiconductor element and the lens in the direction of said optical axis by laser irradiation on said laser location for shrinkage by irradiation.

13. The optical semiconductor device production method as claimed in claim 9, characterized in that said location for shrinkage by laser irradiation is a groove provided in said lens holder, and said second step adjusts the relative positions of the optical semiconductor element and the lens in a direction of an optical axis of the lens by laser irradiation on said groove.

14. The optical semiconductor device production method as claimed in claim 9, characterized in that a hole which is provided in at least one of said mount and said lens holder and has a shape with a corner, said location for shrinkage by laser irradiation is provided at an arbitrary corner portion of said hole, and said second step adjusts the relative positions of the optical semiconductor element and the lens in a direction perpendicular to an optical axis of the lens by laser irradiation on said location for shrinkage by laser irradiation.

15. The optical semiconductor device production method as claimed in claim 9, characterized in that said lens holder comprises a plurality of plate pairs which are connected with each plate pair having plates which are connected at base portions thereof to form an approximate V-shape, said lens is fixed to one plate of an arbitrary plate pair, said location for shrinkage by laser irradiation is provided at a base portion of each plate pair, and said second step adjusts the relative positions of the optical semiconductor element and the lens in a direction perpendicular to an optical axis of the lens by laser irradiation on said location for shrinkage by laser irradiation.

16. The optical semiconductor device production method as claimed in claims 9 to 15, characterized in that said first step includes a substep of accommodating said mount and said lens holder in a package structure which seals said mount and said lens holder.

17. The optical semiconductor device production method as claimed in claim 16, characterized in that said package structure has a window for laser irradiation provided at a portion in correspondence with said location for shrinkage by laser irradiation, and said second step includes the substep of irradiating said location for shrinkage by laser irradiation through said window for laser irradiation.

18. The optical semiconductor device production method as claimed in claim 16, characterized in that said package structure has a window for an outgoing light beam which is emitted form the optical semiconductor element, and said second step includes the substep of irradiating said location for shrinkage by laser irradiation through said window for the outgoing light beam.

* * * * *

UNITED STATES PATENT AND TRADEMARK OFFICE
CERTIFICATE OF CORRECTION

PATENT NO. : 5,033,052

DATED : July 16, 1991

INVENTOR(S) : Takayuki Masuko et al.

It is certified that error appears in the above-identified patent and that said Letters Patent is hereby corrected as shown below:

On the title page item [56] insert

--FOREIGN PATENT DOCUMENTS 62-187807   8/1987   Japan
   62-122292   6/1987   Japan
   61-223609   4/1986   Japan

OTHER PUBLICATIONS

Patent Abstracts of Japan, Vol. 10P, p. 663, "Light Receiving and Emitting Module, JP 62-187807, Matsushita Electric Ind. Co., Ltd., Tatsuro Kato.

Patent Abstracts of Japan, Vol. 147E, p. 554, "Optoelectronic Device", JP 62-122292, Hitachi Tobu Semiconductor Ltd., Tsugio Nemoto--.

Col. 5, line 64, change "DISCLOSURE" to --SUMMARY--.

Col. 8, line 25, change "54, the the" to --54, the lens holder 54a is bent at the--;
line 36, change "of corre-" to --of deformation of the bend of the lens holders 54a corre- --.

UNITED STATES PATENT AND TRADEMARK OFFICE
CERTIFICATE OF CORRECTION

PATENT NO. : 5,033,052
DATED : July 16, 1991
INVENTOR(S) : Takayuki Masuko et al.

It is certified that error appears in the above-identified patent and that said Letters Patent is hereby corrected as shown below:

Col. 10, line 46, change "solidify laser" to --solidify locations for shrinkage by laser--;
        line 47, delete "parts".

Col. 11, line 1, change "the laser" to --the locations for shrinkage by laser--, and delete "parts";
        line 41, after "irradiated" insert --on--;
   line 47, delete "to the optical semiconductor element 40";
        line 51, delete "the" (second occurrence);
   line 55, delete "the" (second occurrence).

UNITED STATES PATENT AND TRADEMARK OFFICE
CERTIFICATE OF CORRECTION

PATENT NO. : 5,033,052

DATED : July 16, 1991

INVENTOR(S) : Takayuki Masuko et al

It is certified that error appears in the above-identified patent and that said Letters Patent is hereby corrected as shown below:

Col. 13, line 12, change 81 b" to --81b--.

Col. 14, line 51, change "the laser" to --the location for shrinkage by laser--, and delete "part".

Col. 15, line 10, change "Hence, which" to --Hence, an optical semiconductor assembly 110 is obtained in which--.

Col. 17, line 43, change "Irradiation" to --irradiation--.

Col. 18, line 40, change "9 to 15" to --9--;
line 55, change "form" to --from--.

Signed and Sealed this

Twenty-second Day of December, 1992

*Attest:*

DOUGLAS B. COMER

*Attesting Officer*        Acting Commissioner of Patents and Trademarks